United States Patent [19]
Buhrer

[11] 3,971,005
[45] July 20, 1976

[54] DUAL ACCESS MAGNETIC DOMAIN MEMORY

[75] Inventor: Carl F. Buhrer, Framingham, Mass.
[73] Assignee: GTE Laboratories Incorporated, Waltham, Mass.
[22] Filed: Jan. 17, 1975
[21] Appl. No.: 541,898

[52] U.S. Cl. .................. 340/174 TF; 340/174 SR
[51] Int. Cl.² ................ G11C 11/14; G11C 19/00
[58] Field of Search ............... 340/174 TF, 174 SR; 323/89; 307/88

[56] References Cited
UNITED STATES PATENTS

| | | | |
|---|---|---|---|
| 3,701,132 | 10/1972 | Bonyhard | 340/174 TF |
| 3,737,882 | 6/1973 | Furuoya | 340/174 TF |
| 3,810,133 | 5/1974 | Bobeck | 340/174 TF |
| 3,838,407 | 9/1974 | Juliussen | 340/174 TF |

*Primary Examiner*—Daryl W. Cook
*Assistant Examiner*—Robert M. Kilgore
*Attorney, Agent, or Firm*—Irving M. Kriegsman; Leslie J. Hart

[57] ABSTRACT

A magnetic domain memory system includes a domain propagation track, having a plurality of minor loops of equal domain capacity, first and second major loops of equal domain capacity and first and second groups of transfer switches which couple each minor loop to the first and second major loops, respectively, and a control system, responding to asynchronous commands, to access any selected record in the minor loop through the first group of unused switches which the circulating record encounters. The accessed records are updated in the major loops, each of which includes a domain detector, generator and annihilator, and the updated records are transferred back into the locations in the minor loops which the original records occupied. The design of the dual access memory provides domain bit synchronization which means that after any domain bit makes one full circulation around the major loop, the bit may be transferred into the same location in the minor loop which the bit originally occupied.

8 Claims, 5 Drawing Figures

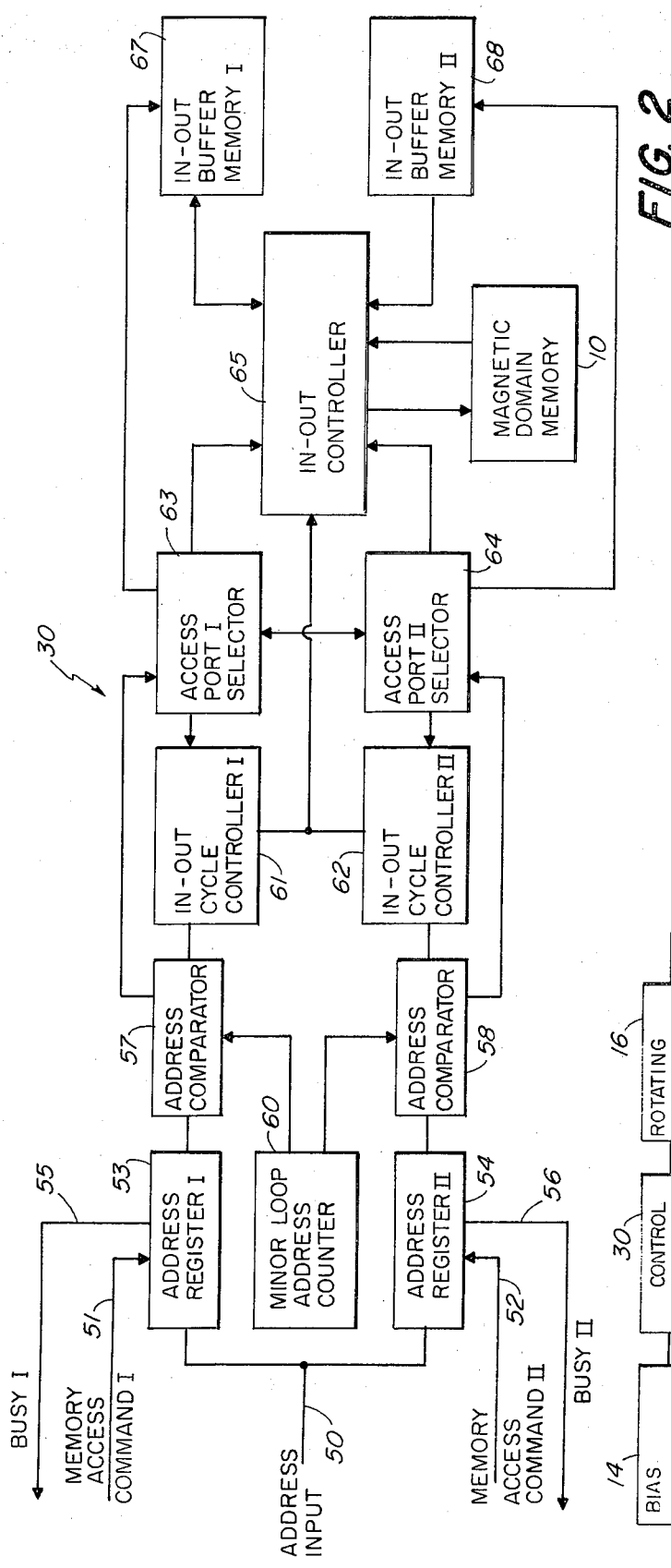
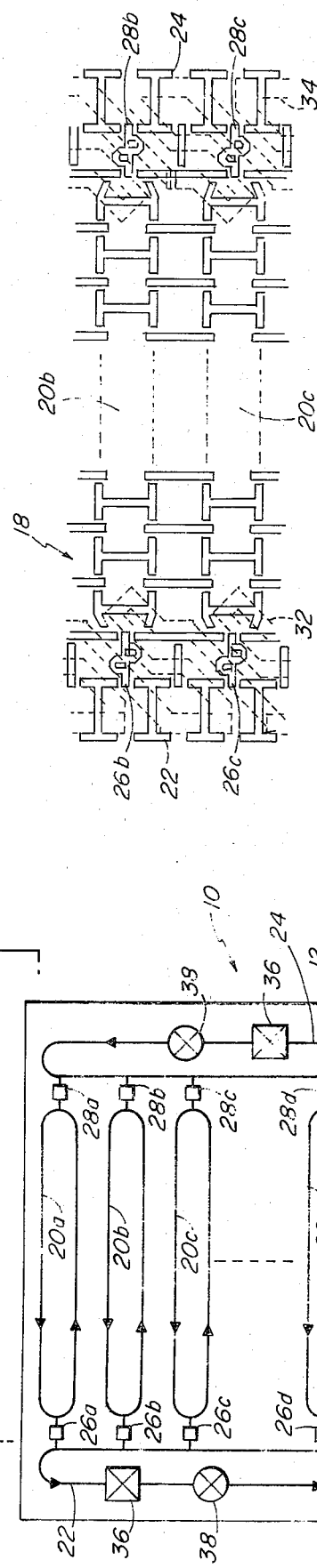
FIG. 2
FIG. 3
FIG. 1

DUAL ACCESS MAGNETIC DOMAIN MEMORY

BACKGROUND OF THE INVENTION

The present invention relates to cylindrical wall magnetic domain memories, and, more specifically, to a major-minor loop organization which provides reduced access time to data stored in the minor loops.

One of the concerns in the development of the cylindrical magnetic domain memory is the reduction of access time to data which is stored in the memory. The patents to Buhrer No. 3,806,901 and to Bonyhard et al., 3,618,054 describe a cylindrical magnetic domain memory utilizing a plurality of minor loops which are accessed through a single major loop. When access to a record in the minor loops is desired, the bits comprising the record are transferred from the minor loops to the major loop.

Various other patents have described techniques for transferring data to and from one or more circulating memory storage loops with a view towards reducing access time to stored data. Among such patents are U.S. Pat. Nos. 3,732,551 to Homma et al., and 3,737,882 to Furuoya. The Homma et al. patent discloses a plurality of unconnected loops in which a writing circuit is at one side of the loop and a readout circuit is at the other side of the loop. The Furuoya patent describes a bubble memory in which readin and readout of data from a plurality of loops occurs at different locations in the loops. However, none of these patents nor any others of which the inventor is aware describes the technique for reducing access time to circulating stored data in the manner described and claimed in the present patent application.

SUMMARY OF THE INVENTION

An object of the present invention is to provide a magnetic domain memory which has dual access to data which is circulating in a plurality of minor loops.

An additional object is to provide a memory in which the average access time for data in the minor loops is approximately equal to the time for any domain bit to circulate around one fourth of the minor loop.

Another object is to provide a domain memory which updates domain bits in each minor loop within the time required for the domain bit location to make a complete circulation around a minor loop.

A further object is to provide a domain memory and control system in which a pair of records, each of which consists of a predetermined number of domain bits from each minor loop, may be accessed and updated in at least partially common time intervals.

An additional object of the invention is to provide a magnetic domain memory in which by accessing sequentially located records in the minor loops a substantially continuous flow of data into or out of the memory may be obtained so that the dead time of the memory approaches zero.

According to the present invention, there is provided a dual access cylindrical magnetic domain memory and a memory control system which, in response to an external command to access and update a predetermined record, accesses the record in a substantially reduced time interval. More specifically, the domain memory has a domain sustaining platelet and a magnetic field bias source which is directed through and normal to the platelet to create therein stable cylindrical magnetic domains. A domain propagation structure includes a track made of a layer of magnetic material of a desired pattern and a source of a rotating magnetic field which is directed in the plane of the layer to move the domains along the track. The track includes a plurality of closed minor loops of equal domain bit capacity and first and second major loops of equal domain bit capacity. Each major loop has a section adjacent to one end of each minor loop designed to accommodate a predetermined number of bits from each minor loop. A first and a second plurality of bidirectional switches couple each of the minor loops to the first and second major loop, respectively; each plurality of switches, when activated simultaneously, transfers domain bits either into or out of the minor loops. The length of the major loops and the switches are selected to provide domain bit synchronization between the minor loops and the major loops for one full domain circulation around the major loops; to obtain such synchronization the ratio of the length of the switches plus the major loop to that of each minor loop is an integer equal to or greater than one. Each major loop includes a domain detector, generator and annihilator for sensing domains in any location and for updating each bit location. In such a memory, the access time, which is defined as the time interval after an access command is received and before the data is read from or written into a major loop, is reduced because the accessed data may be transferred by the first switches which the circulating data encounters. Preferably, the two switches associated with each minor loop are spaced equally with respect to each other so that the maximum length a domain must move to reach either switch is half the length of the minor loop. This feature reduces the average access time by a factor of two over that for known systems which incorporate a number of minor loops and only a single major loop. The predetermined number of domain bits which are transferred between any major loop and each minor loop is equal to or less than the separation between the locations in each major loop to which the switches are coupled. Thus, for example, if two sequential domain bits are read out of each minor loop at a common time interval, the record present in the major loops at the end of the interval comprises a plurality equal to the number of loops of sequentially aligned groups, each of which has two bits. In another feature of the invention, each major loop has a number of bit positions selected to accommodate a predetermined whole multiple of the total of the number of bits transferred from all of the minor loops. Preferably, this multiple is two, and the number of usable domain storage bit locations in each minor loop is the same as the number of bit locations in the major loops. In this arrangement, it is possible to have an almost continuous access and updating of domains if the data in the minor loops is accessed in sequential order. For example, the record in the first address is transferred into one major loop for access by the first set of switches reached within half of the full circulation time corresponding to the minor and major loops. At the end of another half circulation time following completion of the first transfer, the second address, if it directly follows the first address, is located at the switches coupled to the second major loop and begins its transfer for access. The readout or updating processes take place sometime after domain transfer to the major loop depending on the readout, generator and annihilator locations, but with sequential addresses accessed as described, the process will be completed on the first major loop just a few bit positions before the process begins on the second major loop with the following address. The dead time is thereby reduced to a time related to the number of predetermined bits which are read out from each minor loop, because this determines the time separation of sequential record addresses.

In a preferred embodiment of the invention, the memory has a square geometry and a maximum packing density of domain bit locations. For example, if the transfer switches are spaced two bit positions apart on the major loop such that two domain bits can be accessed simultaneously from each major loop, the length along one side of each major loop is equal to the total width of the adjacent rows of minor loops. For such a case, the number of minor loops is one fourth the number of domain bit locations in each major loop. Thus, if each major loop and each minor loop can hold 512 domain bits, to obtain a square geometry there would be 128 minor loops. During access of data, each minor loop transfers out two bits simultaneously so that the major loop has 256 domain bits which fill half the major loop. The switches are of the so-called dollar sign design and the propagation track is of a T-bar construction. In such case it has been found to be necessary in obtaining domain bit synchronization to make the length of the minor loop 513 bits or one domain bit location greater than the major loop.

The control circuit for the memory receives a command to access a preselected record from an external source, which is not a part of the invention, and processes the command by controlling the operation of the domain memory. The minimum total elapsed time between receipt of the command and completion of the memory access cycle equals the time for the addressed bits to reach the closest switches which are coupled to one of the major loops and the time for one complete circulation of domain bits around the major loop. During this time, another command may occur. The complete access cycle time associated with this second command is the time for the bits of the commanded address to reach the other switches and the time for the one circulation of a bit around the second major loop. Thus, the control system which is responsive to a plurality of asynchronous memory access commands performs a complete memory access cycle of a selected record via the unused major loop which is first reached by circulating bits of the selected address.

In one form of the invention, the control system has a binary counter which is synchronized to the rotating magnetic field. This counter identifies the location of the bits of the addresses within each minor loop, the number of addresses being half the number of useable storage domain bits within each minor loop. The count at any instant of time indicates the address of the two domain bits which are present at the transfer switches for one of the major loops. In the preferred embodiment, the count designates the bits which are present at the transfer switches for the first major loop. The system further includes a pair of record processing channels, each of which responds to a command to access a selected record. Each channel has the following structure. A storage device, such as a binary register, receives the address of the record to be accessed. A comparator receives the output of the storage device and the counter and generates an output whenever all the bits, exclusive of the most significant bit, are equal. Because the number of addresses is typically a power of two, such as 256, such output indicates that the selected record is present at one of the groups of transfer switches. Logic circuitry determines whether the other channel is in use and if so, which transfer switches are being used by the other channel. Additional logic circuits, responding to the comparator output and the previously described logic, actuate the transfer switches for the first reached, unused major loop. Logic is also provided for actuating the same transfer switches at the end of the time for a full domain bit circulation around the major loop to return into the minor loop an updated record. Thus, one important feature of the control system resides in the ability to access data through the transfer switch which the data reaches first but subsequent to receipt of an access command. This feature reduces the access time of the memory. Secondly, if that major loop is in use by the other channel, the control register delays access transfer until the selected data is present at the other transfer switches. Thus, two addresses may undergo an access cycle during at least partially common time intervals.

BRIEF DESCRIPTION OF THE DRAWINGS

In the Drawings:

FIG. 1 is a schematic diagram illustrating the organization of a major-minor loop memory according to the principles of the present invention;

FIG. 2 is a block diagram of the control circuit for the memory according to the present invention;

FIG. 3 is a plan view of portions of the major and minor loops and the transfer switches;

DESCRIPTION OF THE PREFERRED EMBODIMENT

Figure 4:
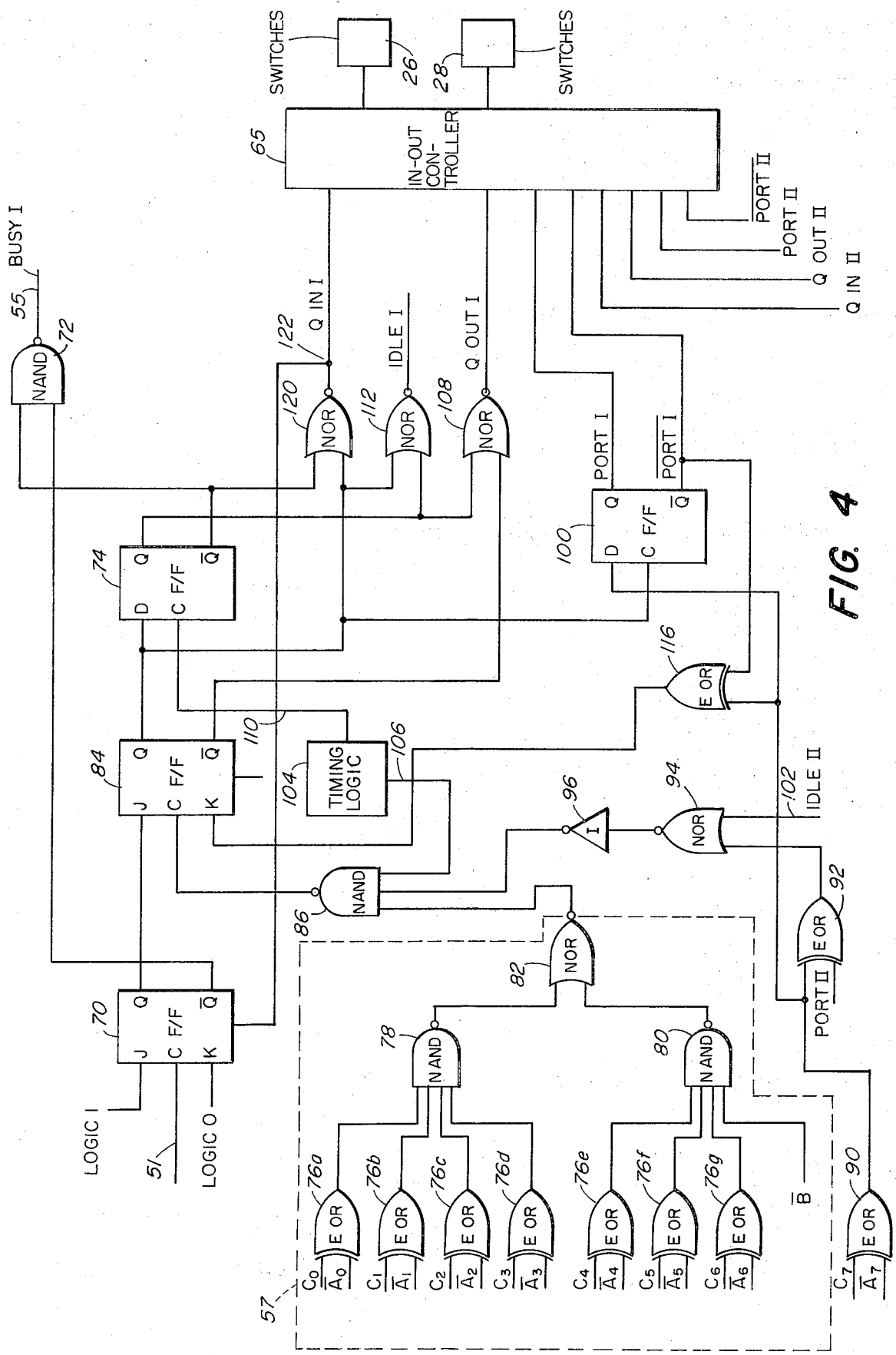
FIG. 4 is a logic circuit diagram of a portion of the control circuit.

In an exemplary embodiment of the present invention, as shown in FIG. 1, there is illustrated a schematic representation of a dual access magnetic domain memory, represented generally by the reference numeral 10. Mobile magnetic domains are contained within a domain sustaining platelet 12 by the provision of a suitable bias magnetic field source 14. The field source 14 provides a magnetic field normal to the plane of the platelet 12. Preferably, the platelet 12 is a thin layer of a single crystal ferri-magnetic garnet which is epitaxially grown on a substrate (not shown) made of a single crystal, non-magnetic garnet. A domain propagation structure includes a propagation track which is represented symbolically by the series of closed loops within the periphery of the platelet 12 and a rotating field source 16. The propagation track as shown in FIG. 3, includes a layer 18 of magnetic elements of a desired pattern. The layer 18 may be deposited, such as by conventional sputtering techniques, directly onto the platelet 12 or onto a separate substrate (not shown) which is then located adjacent to the platelet 12. The magnetic elements may be made of suitable magnetically soft materials and preferably are made of 81 permalloy (81% nickel and 19% iron). The elements are arranged into a T-bar configuration. As is well known in the art, a magnetic domain will propagate along one T and one bar during one complete cycle of the rotating field which is directed in the plane of the layer of magnetic elements.

As shown in FIG. 1, the propagation track includes a plurality of closed minor loops 20a, 20b, 20c and 20d, a first closed major loop 22 and a second closed major loop 24. A first plurality of transfer switches 26a, 26b, 26c and 26d is connected between the left side of the minor loops 20 and the first major loop 22; similarly, a second plurality of transfer switches 28a, 28b, 28c and 28d is connected between the right side of the minor loops 20 and the second major loop 24. The transfer switches permit domains to transfer between the major and minor loops. Preferably, the transfer switches are of the so-called dollar sign configuration, as shown in FIG. 3 of the drawings. FIG. 3 illustrates the details of the transfer switches 26b, 26c, 28b and 28c and portions of the major loops 22 and 24 and the minor loops 20b and 20c. With the dollar sign transfer switch, two domains are transferred from each minor loop as a pair on adjacent cycles of the rotating magnetic field. Thus, the separation between the transfer switches in a major loop corresponds to the distance a domain in the major loop moves in two complete cycles of the rotating magnetic field. The dollar sign switch is bi-directional, and therefore, the same switch transfers domains to and from the minor loop. The operation of this transfer switch is well known to those skilled in the art; additional details may be found in the publication of Smith et al., IEEE Trans, Magnetics, May 9 (3), 285 (1973).

Referring again to FIG. 1, the memory 10 includes a control circuit for actuating the first and second switches to permit transfer of domains between the first and second major loops. The control circuit 30, which is illustrated in more detail in FIG. 2, controls the application of current to the two conductors 32 and 34 which are a part of the first and second groups of switches 26 and 28, respectively. Each major loop 22 and 24 includes a domain detector 36 and a domain generator and annihilator 38. Several types of magnetoresistive detectors may be used; preferably, the detector 36 is a transverse-stretch, chevron detector. The detector includes a group of chevron-shaped elements in the path of the major loop. The width of the elements increases to a maximum and then decreases in width. The elements stretch the domain into a wide strip domain moving perpendicular to its length. At the widest part of the chevrons, the chevrons are connected together to form a zig-zag current path whose resistance is perturbed by the passing strip domain, thereby detecting the domain. Such detector is well known in the art; additional details may be found in the publication of Bonyhard et al., IEEE Trans, Magnetics MAG 9 (3) 433, (1973). Several conventional designs are suitable for the generator and annihilator 38. Preferably, the generator is a field nucleate generator. The annihilator is preferably a dollar sign transfer switch in the major loop, the switch transferring a domain out of the loop and into a guard rail (not shown) such as disclosed in U.S. Pat. No. 3,729,726 to Bobeck.

Several configurations of the major and minor loops are possible. Preferably, the surface area of the platelet 12 is square shaped and the lengths of the major and minor loops are close to powers of two for maximum compatibility with digital systems. The total useful capacity of all the minor loops is $2^n$ domains where $n$ is an even integer. There are $2^{(n/2)+1} + 1$ domain locations in each of $2^{(n/2)-1}$ minor loops. The major loops contain $2^{(n/2)+1}$ domain locations. These choices lead to a propagation pattern which is essentially square for the usual case in which the propagation track period is equal to the intertrack spacing. The odd number of domain locations on each minor loop is a result of geometrical and symmetry restraints in constructing the propagation pattern used for the minor loops, and the one extra location added to satisfy this restraint is not used for storage. The major loops 22 and 24 have one less domain location than each minor loop because the transfer switch design is such that one extra field rotation is needed for the two switch transfers used in the complete accessing cycle. The loop lengths chosen insure that domains removed from the minor loops return to their same relative locations after traveling once around a major loop during an access cycle.

The following table illustrates the various sizes of the loops for various memory capacities.

| memory capacity | | number of minor loops | capacity of each minor loop | capacity of each major loop |
|---|---|---|---|---|
| n | $2^n$ | $2^{(n/2)-1}$ | $2^{(n/2)}+1$ | $2^{(n/2)+1}$ |
| 12 | 4096 | 32 | 129 | 128 |
| 14 | 16,384 | 64 | 257 | 256 |
| 16 | 65,536 | 128 | 513 | 512 |

In the preferred embodiment, the integer $n$ is 16; thus, each major loop 22 and 24 has 512 domain positions, each of 128 minor loops 20 having 513 domain locations.

The advantage of the invention resides in reduced time for accessing a record and reduced dead times, both of which are possible due to the additional major loop.

The sections of the major loops 22 and 24, where the detection and updating functions (bubble generation and annihilation) are located, are separated from the closest transfer switch by a region in which the bubbles are expanded transversely, and these sections are therefore free of bubbles when two bubbles are transferred from each minor loop as a pair on adjacent clock cycles. There is therefore a delay between transfer and readout corresponding to the number of bit positions between the closest transfer switch and the detector. This plus one fourth the minor loop size determines the average access time of the memory. The remaining portion of the major loop represents the distance all the bubbles must traverse before returning to their transfer switches and constitutes additional dead time after readout is completed during which the memory is unavailable for further access. It is a purpose of this invention to illustrate that by using the two accessing major loops, the accessing time and the dead time can be reduced on the average in a series of accessing operations.

This bubble memory 10 is used with a control circuit 30, shown in block diagram form in FIG. 2, that is designed to control the movement of bubble domains so as to achieve the shorter access times and shorter dead times made possible by the second major loop. The shorter accessing time is a result of the presence of two transfer switches at opposite ends of the minor loops. Since the memory can initiate access at either end of the minor loops depending only on which major loop the two selected bubbles per minor loop reach first, this component of the access time is on the average only half as long as if only one major loop were present. Further, if a second address is requested before the start of accessing of the bubbles corresponding to the first address, either pair of corresponding bubbles on all the minor loops can reach the transfer switches of either port first. That port would then become busy and unavailable for the other bubble pair which would be transferred onto the remaining port when the other bubble pair reached that non-busy loop. If the second address is requested after one major loop becomes busy, the non-busy loop is available as soon as the corresponding domain pairs reach its transfer switches. Thus, the memory can process two access requests simultaneously with input-output data transfer of the two data blocks overlapping in time. Thus, the dead time of the memory is partly eliminated. In certain cases, the dead time can go almost to zero, and an almost continuous stream of data can be transferred.

In a preferred embodiment as described previously, there are 513 bit positions in each of 128 minor loops and 512 bit positions in each major loop. There are 256 addresses each contributing 2 bits to each minor loop with one bit per minor loop not being used. Each address corresponds to 256 bits transferring to a major loop and filling only half of it. If the next address in sequence is immediately requested, the following pair of bubbles in each minor loop passes the major loop which has just become busy and propagates 256½ bit positions for transfer onto the other major loop. Its input-output data transfer takes place, therefore, 258½ rotating magnetic field cycles later than that of the preceding address and begins just 2½ field cycles after the previous input-output data transfer ends. Thus, the data transfer rate to or from this bubble memory design can, averaged over several record accesses, approach closely the clock rate of the driving magnetic field.

The control system shown in FIG. 2 is designed to program the dual access major-minor loop bubble domain memory in such a way as to minimize the system access and cycle times. The system receives a pair of memory access command input port signals 51 and 52 which when activated cause a record address presented at an address input line 50 to be stored in the corresponding one of a pair of address registers 53 and 54. As used herein, "port" is an input-output channel in which an address can be stored and processed. The terms "access loop" or "major loop" refer to opposite ends of the memory; "port" refers to electrical address registers each of which can make use of either access loop. The signals 51 and 52 are derived from another portion (not shown) of the computer and represent a command to use the respective port channel for the next record address accessing. When so stored, a corresponding busy output signal 55 or 56 occurs to acknowledge that a request for memory access has been received and stored, but that the cycle has not yet been completed. A minor loop address counter 60 counts through the addresses representing the bubble domains in the minor loops. For example, in the specific case described above in which each minor loop contained 513 bit positions for bubbles, the counter would count from 0 to 255, each address representing two bubbles except two (for example, addresses 127 and 255) which would represent 2½ bubble locations, the extra two halves being the odd wasted location which is not utilized for data storage. The counter is advanced one address for each 2 or 2½ cycles of the rotating magnetic drive field. The extra unused bit location is split and represented in two symmetrically opposed locations in the address counter cycle to allow for the half cycle of field rotation corresponding to the 180° angular orientation difference between the two major accessing loops. By this means the two loops remain symmetrically equivalent with respect to the timing signals derived from the address counter, and the timing circuitry for the various transfer pulses is simplified.

The address stored in the register 53 or 54 is compared with the address in the counter 60 by one of a pair of address comparators 57 and 58 which recognize the two cases in which the count and the address are equal or different by one half the address range which would be 128 for the case described above. An equality would signify access via the left major loop 22 of FIG. 1 while the latter half range difference would signify access by the right side major loop 24. When either condition is recognized by the comparator 57, the identity of the major loop selected is stored in an access port I selector 63, but only if that major loop is not already selected in an access port II selector 64. If the major loop has been found to be free and so selected, an in-out cycle controller I 61 initiates the input-output access cycle using the selected loop, and bubble domain data from magnetic domain memory 10 is transferred to or from an in-out buffer memory I 67 under control of an in-out controller 65. If either type of comparison is recognized by the comparator 58, the identity of the major loop selected is similarly stored in an access port II selector 64, but again only if the loop is free. If so, an in-out cycle controller II 62 initiates input-output access cycle using the selected loop and bubble domain data from the memory 10 transferred to or from an in-out buffer memory II 68 also under control of the in-out controller 65. Thus, the resulting operation is that either access command input port and corresponding in-out buffer memory port is able to use either major loop to transfer data to or from the bubble memory. Each selects whichever major loop is best for fastest access subject only to the restriction that a major loop already in use may not be used.

Buffer memories 67 and 68 should preferably be of the random access type and should each have at least the same capacity as one record of words of the bubble memory 10. In a typical bubble memory system a number of the memory planes, for example eight, would be sharing the same rotating magnetic drive field 14 and the in-out controller 65, shown in FIG. 2. Each would correspond to one bit in an eight-bit word and the minimum size of the buffers would be eight times the record length of 256 words. The in-out controller 65, in addition to providing the various current pulses to the bubble memory 10 for operating the transfer switches 26 and 28, bubble generators and annihilators 38 and detectors 36, must also provide the addressing information to both of the random access buffer memories 67 and 68 to direct the proper exchange of data. The random access characteristic of the buffer memories is necessary because of the differences between the data transfer sequences when using the two major loops. For the data in any one address, the two bits in the minor loop 20a will be the first to reach the detector 36 if the major loop 22 is used, while the two bits in the minor loop 20d will be the first to reach the output port detector 36 if the major loop 24 is used. To compensate for this nearly reversed order of data transfer, it is only required that the addresses be sent to the random access buffer memories 67 and 68 in the appropriate sequences depending on which major loop is used on the bubble memory 10.

In many applications, the buffer memories 67 and 68 described above would not be internal to the bubble memory system. For example, when the bubble memory is used as a peripheral device with a computer system having an internal random access memory, parts of that memory selected by the computer would be used in place of the above-described buffers. Data would be transferred by the technique commonly referred to as a direct memory access in which the computer processor allows the bubble memory controller to read from and write into the designated segment of the computer random access memory without help from the processor.

Figure 5:
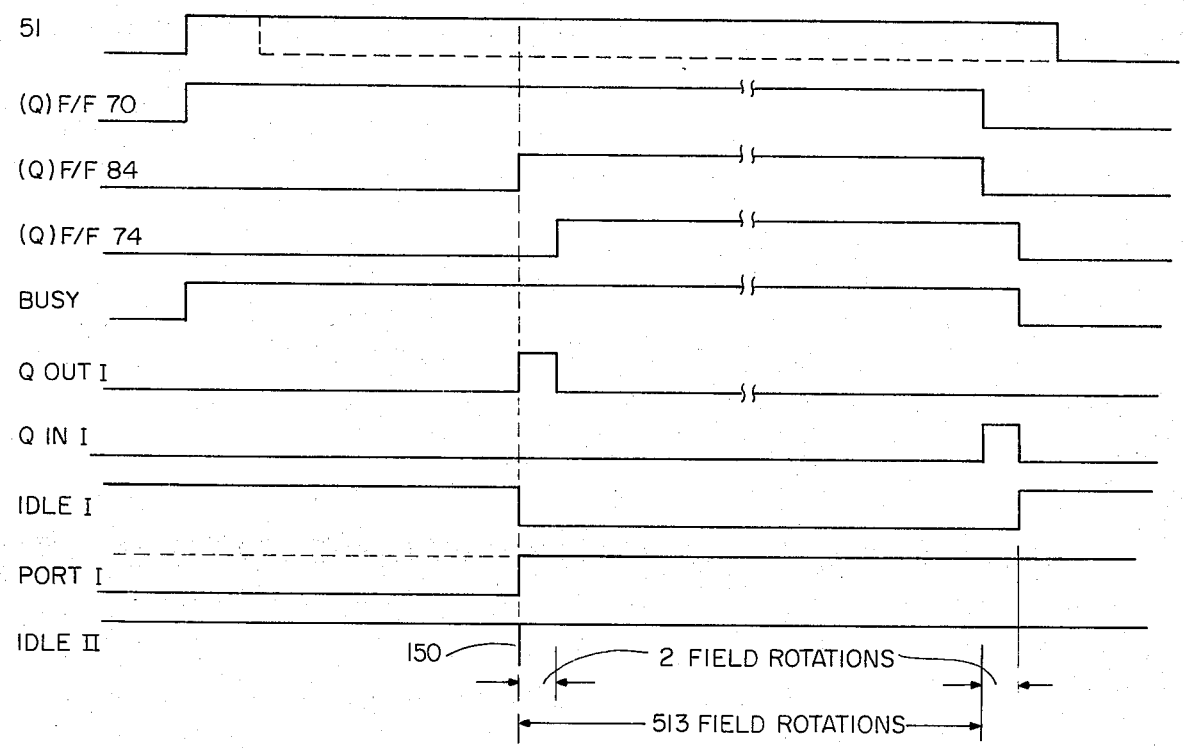
FIG. 5 is a diagram illustrating the various waveforms generated by the circuit of FIG. 4.

The operation of the control 30 will now be described in more detail with reference to the logic circuit in FIG. 4 and the waveforms on FIG. 5. FIG. 4 shows the logic for port I and it is to be understood that a similar circuit exists for port II. The port I circuit is activated by the memory access command 51. When the command 51 goes to a logic 1, as shown in FIG. 5, a flip flop 70 is set. Since the Q output of the F/F 70 is applied to the input of a NAND gate 72 whose output is the BUSY I signal 55, the signal 55 becomes a logic 1. At this time when the F/F 70 turns on, the address is stored in the address register 53 in FIG. 2. The counter 60 runs continuously. The counter 60 is preferably a eight stage binary divider. The outputs of the register 53 and the counter 60 are sent to the comparator 57 which in FIG. 4 includes the exclusive OR gates 76a through 76g, NAND gates 78 and 80 and NOR gate 82. The input to each exclusive OR gate is the true state of one counter stage and the inverted state of the corresponding register stage of the address. For example, the inputs to exclusive OR 76a is the true state Co of the least significant bit (LSB) of the counter 60 and the inverted state Ao of the LSB of the address register 53. The first seven stages are compared for equality. The output of exclusive OR 76a is $Co \cdot Ao + \overline{Co} \cdot \overline{Ao}$, and this output is a logic 1 when the logic states of the LSBs are equal.

When the comparison of all stages is true and the input B is on, indicating that the extra non-accessed bit is not at a position where it would be transferred, the output of circuitry 57 is on. The input B is derived from the circuit that advances the address register every 2 or 2½ field rotations and is off during the extra half field rotation of those two addresses in which the extra half cycles are inserted. The in-out cycle controller 61 comprises a flip flop F/F 84, a NAND gate 86 and the logic which controls the input to the NAND 86. The flip flop 84 and 70 operate as follows: There is no change in state, absent an unconditional set or reset input, until a change in logic level occurs at the input C. When C has the input level going from a logic 0 to a logic 1 the F/F operates according to the following table.

| J | K | Q | $\overline{Q}$ |
|---|---|---|---|
| 0 | 0 | no change | |
| 0 | 1 | 0 | 1 |
| 1 | 0 | 1 | 0 |
| 1 | 1 | change | |

During the time from the setting of F/F 70 until the time that the comparator senses a comparison of all but the most significant bit (MSB) of the words in the address and the counter registers, the output of the NAND gate 86 is a logic 1.

The NAND gate 86 determines when the memory access cycle should begin by checking for several conditions. The gate 86 provides a logic 0 output when the cycle is to commence, and this occurs only when each input to the gate 86 is a logic 1. The first condition is that the comparator senses a comparison of all but the MSB; when this condition occurs, the output of the NOR gate 82 is a logic 1. The second condition is derived from the logic comprising exclusive OR gates 90 and 92, a NOR gate 94 and an inverter 96. The gate 90 has inputs of $C_7$ and $\overline{A}_7$ and has a logic 1 output when the most significant bits (LSB) of the counter and the address are equal. The gate 92 has inputs from the output of gate 90 and a signal PORT II. The signal PORT II is generated from the channel II control and is similar to a signal PORT I which is generated from a flip flop 100 which stores the comparison signal to the MSB when the access cycle is initiated. PORT II may be either a logic 1 or 0 depending upon the previous state of the controller. The inputs to the NOR gate 94 comprise the output of the gate 92 and a signal 102 which is termed IDLE II. This signal is derived from the PORT II controller and is a logic 1 if the other channel is idle, that is, not using either groups of transfer switches for memory access. This logic operates as follows. If the other channel is idle the output of inverter 96 is a logic 1. If the other channel is in use (i.e., IDLE II = 0), the inverter 96 has a logic 1 output when the MSB compares and PORT II is a logic 0 or when the MSB does not compare and PORT II is a logic 1. The third input to the gate 86 is from a timing logic 104. An output 106 provides a positive pulse of quarter cycle duration once per every two cycles of the rotating magnetic drive field so as to avoid starting an access cycle with the second bubble of a pair which must not be split up. The trailing edge of the pulse from 106 controls the timing of flip flop 86. The phase of the pulse is adjusted to compensate for the extra half field rotation cycle introduced twice per loop circulation time so as to insure that the start of the access cycle takes place at the same field orientation angle for all addresses when one major loop is used and at a 180° opposite orientation angle when the other major loop is used.

In FIG. 5, the waveforms are illustrated for the situation in which the F/F 84 is set the first time that all but the MSB of the counter and the address compare. This occurs because channel II is idle. When flip flop 84 is set, the output of NOR gate 108 becomes enabled. The output of the gate 108 which is designated Q OUT I remains a logic 1 for two cycles of the rotating field until flip flop 74 comes on. This is controlled by an output 110 of the timing logic 104 which is applied to the C input of the flip flop 74. The output 110 changes the state of 74 to the same state as 84 two cycles after the output 106 goes to a logic 0. The signal Q OUT 1 controls the interval in which one of the groups of transfer switches will be enabled to transfer two bits of data from each minor loop. A NOR gate 112 generates a signal IDLE I which when it goes to logic 0 indicates that an access cycle has commenced. This signal goes to the control logic for channel II and performs the same function as the signal IDLE II performs in the logic in FIG. 4. After 513 field rotations, the flip flop 84 is reset by the output of an exclusive OR gate 116. The output of gate 116 is a logic 1 if the MSBs are equal and PORT I is a logic 1 or if the MSBs are not equal and PORT I is a logic 0. Two field rotations later, flip flop 74 is reset and during those two cycles a NOR gate 120 provides an output 122, which is Q IN I. Q IN I is the gating signal for transfer back into the minor loops. It also resets flip flop 70.

The in-out controller 65 contains appropriate logic to operate the transfer switches 26 and 28 and receives as inputs the Q IN, Q OUT and PORT signals from both channels I and II. Transfer switches 26 are enabled when either PORT I or PORT II is a logic 1. Transfer switches 28 are enabled when either PORT I or PORT II is a logic 0 and when either Q IN I or II or Q OUT I or II is a logic 1. Approximately 30 – 50 milliamperes of current is passed through each enabled switch for a quarter field rotation beginning when the domain to be transferred reaches the input end of the switch. Thus, when one of the PORT signals is a 1, transfer switches 26 are enabled within the appropriate 2 cycle intervals and when one of the PORT signals is a 0, transfer switches 28 are enabled within the appropriate two cycle intervals.

The operation is now summarized with reference to FIG. 5. We assume channel II is idle, and the PORT I signal is logic 0, it being understood that PORT I could have been logic 1 (see dotted line). At the time represented by line 150 in FIG. 5, the flip flop 84 sets, irrespective of the states of the most significant bits because IDLE II is a logic 1. This is in accordance with the desired feature of accessing data from the first reached, unused switches. Let us assume that the word address is such that the most significant bits do in fact compare; this means the bits are located at the transfer switches 26. Thus, the output of exclusive OR gate 90 is a logic 1 and this output is applied to input D of the flip flop 100. Thus, when flip flop 84 sets, flip flop 100 also sets, making PORT I a logic 1. This flip flop and the flip flop 74 operate as follows; when input C goes to logic 1, the output Q follows the input D. With PORT I a logic 1, only transfer switches 26 may be enabled, and they are so enabled when Q OUT I and Q IN I become a logic 1.

Let us now assume that channel II is busy processing an address via transfer switches 26, and channel I now receives a command to access an address. Thus, IDLE 2 is a logic 0 and PORT II is a logic 1. Under these circumstances at time 150 in FIG. 5, the flip flop 84 does not set even though all the bits compare. This is because inverter 96 output is not a logic 1. Let us assume that the most significant bits do compare so that the output of gate 92 is a logic 0. Since IDLE II is also a logic 0, the input to inverter 96 is a logic 1. Thus, at time 150, the bits in the address pass the switches 26 without being transferred. At about 256 field rotations later, the word is about to pass by transfer switches 28. Now, flip flop 84 becomes set because all but the MSB will compare. Also, either channel II is complete making IDLE II a logic 1 or if not, the MSB does not compare making the output of gate 92 a logic 1. Since the MSB's do not compare, the flip flop 100 has an output of PORT I = 0. Since PORT I is a logic 0, the in-out controller 65 activates the switches 28 during the intervals that Q IN I and Q OUT I are logic 1s. This describes another feature of the invention which is accessing a record by bypassing a group of transfer switches which are being used and proceeded to the next group of switches.

The embodiment of the present invention is intended to be merely exemplary and those skilled in the art shall be able to make numerous variations in and modifications to the embodiment without departing from the spirit of the present invention. All such modifications and variations are intended to be included within the scope of the present invention as defined in the appended claims.

I claim:
1. A cylindrical magnetic domain memory, comprising:
   a. a domain sustaining platelet and bias magnetic field means for creating stable cylindrical magnetic domains in the platelet,
   b. a domain propagation structure including a propagation track made of a layer of magnetic elements of a desired pattern and rotating magnetic field means for creating unidirectional motion of the domains along the track, the propagation track including a plurality of closed minor loops of equal domain capacity and first and second closed major loops of equal domain capacity,
   the major loops having a domain bit length selected to accommodate a predetermined number of bits from each of the minor loops,
   c. first and second transfer switch means connecting each minor loop to the first and second major loops respectively for transferring domains between the major and minor loops,
   the length of the minor loops and the major loops and domain switch means being selected to provide domain position synchronization between the minor loops and each major loop for each full domain circulation around the major loop and
   d. a domain detector, generator and annihilator disposed in each major loop.

2. The memory according to claim 1, wherein the number of domaain bit positions in each minor loop between the first and second switch means is one half the total number of domain bit positions such that the maximum length a domain must circulate within the minor loop to reach any one of the first and second transfer switch means is half the length of the minor loop.

3. The memory according to claim 1, wherein the domain bit length separating adjacent transfer switch means coupling to the major loop is equal to the predetermined number of bits which are transferred between the major loop and each minor loop.

4. The memory according to claim 2, wherein each major loop has a number of bit positions selected to accommodate a predetermined whole multiple of the total number of bits transferred from all of the minor loops.

5. The memory according to claim 4, wherein the multiple is two and the number of bit locations in each major loop and the number of useable storage locations in each minor loop is equal such that said memory can provide a substantially continuous readout and readin of data when consecutive groups of the predetermined number of bits in the minor loops are selected.

6. A magnetic domain memory system for accessing and updating a selected record in the memory including:
   a. a domain sustaining platelet,
   b. a source of a magnetic field which is normal to the platelet,
   c. a domain propagation track of a layer of magnetic elements, the track including a plurality of minor loops and first and second major loops,
   d. a source of rotating magnetic field which is in the plane of the track, e. first and second transfer switch means coupling each minor loop to the first and second major loops, f. a domain detector, generator, and annihilator in each major loop, g. with each minor loop having the same domain capacity and each major loop having the same domain capacity, the record having a total number of bits equal to the total of an equal predetermined number of domain bits from each minor loop, the length of each major loop and the number of minor loops being such that each record occupies half the major loop, the bits of the updated record being inserted back into the location in the minor loop occupied by the original record at the time for a complete circulation of any bit around the major loop, and h. control means responsive to a plurality of asynchronous commands to access selected records for transferring each selected record out of the minor loops and into the unused major loop which is first reached by the record and for transferring back into the bit locations of the record in the minor loops an updated record in the time for any bit to make a full circulation around the major loop.

7. A cylindrical magnetic domain memory system comprising:

a. a domain sustaining platelet and means for generating a bias magnetic field normal to the platelet to create stable cylindrical magnetic domains in the platelet, b. a domain propagation structure including a propagation track made of a layer of magnetic elements of a desired pattern and means for creating a rotating magnetic field parallel in the plane of the layer to move the domains along the track, the propagation track including a plurality of closed minor loops and first and second major loops, c. first and second bidirectional transfer switch means at opposite ends of each minor loop coupling each minor loop to the first and second major loop, each plurality of first and second switch means being such as to transfer a predetermined number of domain bits out from each minor loop simultaneously and to transfer a predetermined number of domain bits into each minor loop simultaneously, d. the length of each minor loop, the magnitude of the predetermined number of bits transferred to or from each minor loop, and the number of minor loops being selected to transfer a record comprising the total number of predetermined bits from the minor loops into one major loop and to transfer the same record with or without updating back into the minor loops such that domain position synchronization is obtained for each full domain circulation around the major loops, e. a domain detector, generator and annihilator disposed in each major loop and, f. a control means responsive to asynchronous commands to access predetermined records in the minor loops for accessing any record through the closest unused transfer switch means to which the record arrives after receipt of the command.

8. The system according to claim 7, wherein the control means includes:

a. a counter synchronized with the rotating field whose absolute count at any time represents the presence of a predetermined record in the minor loops at the first transfer switch means, b. a pair of record processing channels, each of which responds to an asynchronous command to access a predetermined record and actuates either of the transfer switch means, c. each channel including
1. means for storing an address of the predetermined record to be accessed,
2. means for comparing the address with the count in the counter exclusive of the most significant bit to determine when the record is first present at one of the transfer switch means,
3. means for determining which, if any, of the first and second transfer switch means utilized by the other of the pair of channels,
4. means responsive to the output of the comparing means and the determining means for actuating the closest unused switch means to transfer the record into the respective major loop and
5. means for transferring an updated record from the major loop into the minor loop at the bit locations of the original record.

* * * * *

UNITED STATES PATENT OFFICE
CERTIFICATE OF CORRECTION

Patent No. 3,971,005　　　　Dated July 20, 1976

Inventor(s) Carl F. Buhrer

It is certified that error appears in the above-identified patent and that said Letters Patent are hereby corrected as shown below:

Column 5, line 27, "May 9" should read --MAG 9--.
Column 9, line 21, "Q" should read --$\bar{Q}$--.
Column 9, line 26, "a" should read --an--.
Column 9, line 36, "Ao" should read --$\overline{Ao}$--.
Column 9, line 38, "Co·Ao + Co·Ao" should read --Co·Ao + $\overline{Co·Ao}$--.
Column 9, line 42, "B" should read --$\bar{B}$--.
Column 9, line 44, "B" should read --$\bar{B}$--.
Column 10, line 12, "(LSB)" should read --(MSB)--.
Column 12, line 27, delete "domain".
Column 12, line 34, "domaain" should read --domain--.

Signed and Sealed this

Twelfth Day of October 1976

[SEAL]

Attest:

RUTH C. MASON
Attesting Officer

C. MARSHALL DANN
Commissioner of Patents and Trademarks